United States Patent [19]
Hamashima et al.

[11] Patent Number: 5,118,947
[45] Date of Patent: Jun. 2, 1992

[54] INFRARED RAYS DETECTING APPARATUS WITH INTEGRAL TEMPERATURE CONTROL ELEMENT

[75] Inventors: Shigeki Hamashima, Yokohama; Masaru Koseto, Akashi; Koji Hirota, Yokohama, all of Japan

[73] Assignee: Fujitsu Limited, Kawasaki, Japan

[21] Appl. No.: 556,451

[22] Filed: Jul. 24, 1990

[30] Foreign Application Priority Data

Jul. 25, 1989 [JP] Japan .................................. 1-190606

[51] Int. Cl.[5] .................. H01L 31/024; H01L 31/0296
[52] U.S. Cl. .............................. 250/352; 250/338.1; 250/338.4; 250/349; 250/370.13; 250/370.15
[58] Field of Search .................... 250/352, 349, 338.1, 250/370.15, 370.13, 338.4, 352, 349

[56] References Cited

U.S. PATENT DOCUMENTS

| | | | |
|---|---|---|---|
| 3,453,432 | 7/1969 | McHenry | 250/338.3 |
| 3,629,585 | 12/1971 | Desvignes et al. | 250/350 |
| 4,321,615 | 3/1982 | Blackman et al. | 357/30 |
| 4,565,925 | 1/1986 | Anderson et al. | 250/352 |
| 4,792,682 | 12/1988 | Endou et al. | 250/338.3 |
| 4,862,002 | 8/1989 | Wang et al. | 250/332 |

FOREIGN PATENT DOCUMENTS

| | | | |
|---|---|---|---|
| 2304908 | 10/1976 | France | 250/370.15 |
| 57-189031 | 11/1982 | Japan | 250/338.4 |
| 62-21024 | 1/1987 | Japan | 250/352 |

*Primary Examiner*—Constantine Hannaher
*Attorney, Agent, or Firm*—Staas & Halsey

[57] ABSTRACT

A cooling type infrared rays detecting apparatus is disclosed which prevents a fluctuation of an infrared rays image arising from a variation of the cooling temperature. The infrared rays detecting apparatus includes a dummy element mounted adjacent an infrared rays detecting device on a device mounting portion of an inner tube. The dummy element has a similar structure to that of each of infrared rays detecting elements of the infrared rays detecting device and is formed from the same material as the latter. A temperature variation of the dummy element is detected from a variation in resistance of the dummy element, and an output of the infrared rays detecting device is compensated for in response to the thus detected temperature variation to prevent a possible fluctuation of an infrared rays image arising from a temperature variation. Consequently, an infrared rays image of a high quality can be obtained.

6 Claims, 4 Drawing Sheets

INFRARED RAYS DETECTING APPARATUS WITH INTEGRAL TEMPERATURE CONTROL ELEMENT

BACKGROUND OF THE INVENTION

This invention relates generally to an infrared rays detecting apparatus, and more particularly to a cooling type infrared ray detecting apparatus which is cooled to a low temperature when in use.

Infrared rays detecting apparatus or infrared rays sensors are used in various fields such as meteorological observation by an artificial satellite, prevention of crimes, prevention of disasters, geological and resources investigations, medical treatment by infrared rays thermography and so forth because it can detect presence, a profile, a temperature, a composition and so forth of an object body without contacting the object body. Such infrared rays sensors are roughly classified into thermal sensors and sensors of the photoelectric effect type which make use of a semiconductor.

While thermal sensors generally have no wavelength dependency of sensitivity, they are low in sensitivity and also in speed of response, and accordingly, they are not suitably used as real time infrared rays sensors. On the other hand, while photoelectric effect sensors are high in sensitivity and speed of response, it is necessary to cool a sensing element or device substantially at a temperature of liquid nitrogen. Photoelectric effect sensors are classified into those of the photoconductive type, the photoelectromotive force type and the MIS type. Photoelectric effect sensors of the photoconductive type make use of a variation in resistance upon irradiation of light, and conventionally known sensors of the type just mentioned employ an infrared rays detecting device or element composed of a compound semiconductor crystal, for example, HgCdTe or the like.

An infrared rays detecting device of such photoconductive type is used in a condition that it is cooled substantially to a temperature of liquid nitrogen as described above in order to assure a high detection sensitivity. To this end, an infrared rays detecting apparatus is conventionally constructed such that a vacuum vessel having a high adiabatic characteristic is used and a device mounting portion in the vacuum vessel is cooled to a predetermined temperature by means of coolant such as liquid nitrogen or by means of a cryogenic cooling apparatus when the infrared rays detecting device is to be rendered operative.

An example of a conventional infrared rays detecting apparatus is described subsequently with reference to FIG. 1. A vacuum vessel 2 includes an outer tube 4 formed, for example, from KOVAR, and an inner tube 6 formed from KOVAR and glass joined together. As known in the art, KOVAR is an alloy of nickel, iron and cobalt. The spacing between the outer and inner tubes 4 and 6 is vacuum drawn to a very low pressure. A germanium window 8 through which infrared rays pass is provided at a top portion of the outer tube 4. Meanwhile, a device mounting portion 6a is provided at a top portion of the inner tube 6, and an infrared rays detecting device 10 formed, for example, from HgCdTe crystal and a temperature sensor 20 formed from a silicon diode or the like are provided on the device mounting portion 6a.

The device mounting portion 6a of the inner tube 6 is cooled to a very low temperature by means of coolant of liquid nitrogen or the like or by a cryogenic cooling device so as to assure a high sensitivity of the infrared rays detecting device 10. The infrared rays detecting device 10 is connected to a signal detection circuit 18 by way of a first pair of lead wires 12, a pair of terminals 14 and a second pair of lead wires 16. Meanwhile, the temperature sensor 20 is connected to a temperature control circuit 28 by way of a pair of lead wires 22, a pair of terminals 24 and another pair of lead wires 26. The temperature control circuit 28 controls the temperature of the device mounting portion 6a in response to a temperature detected by the temperature sensor 20 so that it may be kept at a fixed level in order to obtain an output of the infrared rays detecting device 10 corresponding to an amount of infrared rays incident thereon.

In this manner, the conventional infrared rays detecting apparatus controls the cooling temperature of the device mounting portion 6a such that it may be kept at a fixed level by way of the temperature sensor which is provided independently of the infrared rays detecting device 10. The temperature sensor 20 is formed from a material different from that of the infrared rays detecting device. However, in the conventional cooling temperature control wherein such a temperature sensor is employed, it is difficult to control the temperature of the mounting portion of the infrared rays detecting device strictly to a predetermined temperature, and the temperature of the detecting device mounting portion varies within a range of $\pm 1°$ C. or so with respect to the predetermined temperature. Since the cooling temperature has such a width of variation, characteristics such as resistance of the infrared rays detecting device are varied in response to the cooling temperature, and accordingly, there is a problem that a fluctuation takes place in an infrared rays image.

SUMMARY OF THE INVENTION

Accordingly, it is an object of the present invention to provide a cooling type infrared rays detecting apparatus which prevents a possible fluctuation of an infrared rays image which may arise from a variation of the cooling temperature.

In accordance with an aspect of the present invention, there is provided an infrared rays detecting apparatus which comprises an outer tube having a window through which infrared rays pass; an inner tube having a device mounting portion at an end thereof; means for maintaining a spacing between the outer tube and the inner tube in a vacuum condition; an infrared rays detecting device mounted on the device mounting portion of the inner tube; a dummy element mounted adjacent to the infrared rays detecting device on the device mounting portion of the inner tube, the dummy element being formed from the same material as the infrared rays detecting device; cryogenic cooling means for cooling the infrared rays detecting device and the dummy element to a low temperature; temperature detecting means connected to the dummy element for detecting a temperature of the dummy element; and correcting means for correcting an output of the infrared rays detecting device in response to a temperature detected by the temperature detecting means.

With the infrared rays detecting apparatus of the present invention described above, the dummy element is formed from the same material as the infrared rays detecting device and has a similar structure to that of the infrared rays detecting device except that it has no light detecting portion, and the dummy element is mounted adjacent the infrared rays detecting device on the device mounting portion. Consequently, when no infrared rays are introduced into the infrared rays detecting apparatus, the resistance of the infrared rays detecting device is equal to the resistance of the dummy element. Since a variation of the resistance of the infrared rays detecting device arising from a variation in temperature can be detected from the dummy element, such variation of the resistance of the infrared rays detecting device arising from a temperature variation can be compensated for by correcting an output of the infrared rays detecting device by the correcting means in response to a temperature detected by the temperature detecting means. Consequently, a possible fluctuation of an infrared rays image which may arise from a temperature variation can be prevented.

The above and other objects, features and advantages of the present invention and the manner of realizing them will become more apparent, and the invention itself will best be understood, from a study of the following description and appended claims, with reference to the attached drawings showing some preferred embodiments of the invention.

DESCRIPTION OF THE PREFERRED EMBODIMENT

Figure 1:
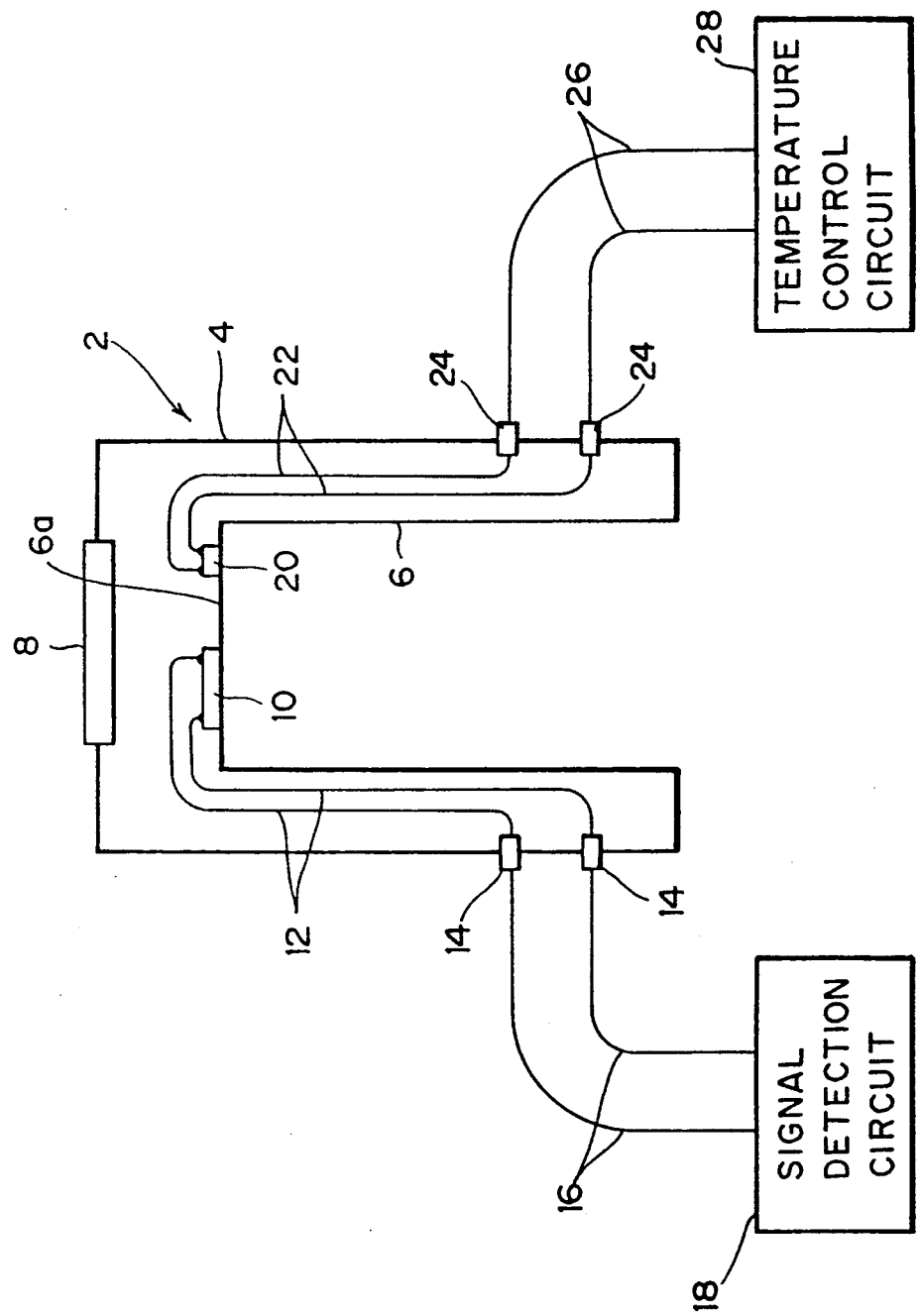
FIG. 1 is a schematic diagrammatic view of an exemplary conventional infrared rays detecting apparatus.

In the following, an embodiment of the present invention will be described in detail with reference to the drawings. In the following description of the embodiment of the present invention, like elements are denoted by like reference numerals to those of the conventional apparatus shown in FIG. 1, and description thereof will be partly omitted herein.

Figure 2:
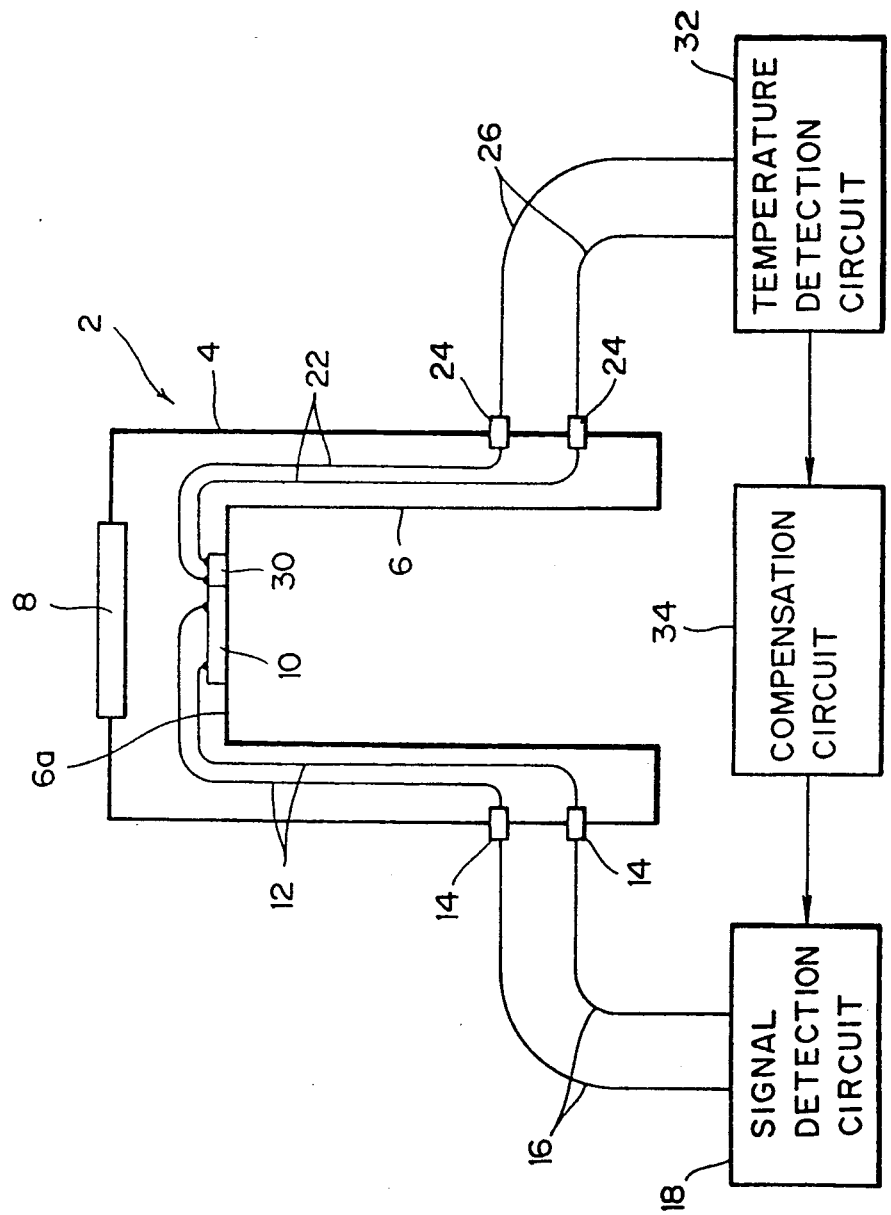
FIG. 2 is a schematic diagrammatic view of an infrared rays detecting apparatus showing an embodiment of the present invention.
Figure 3:
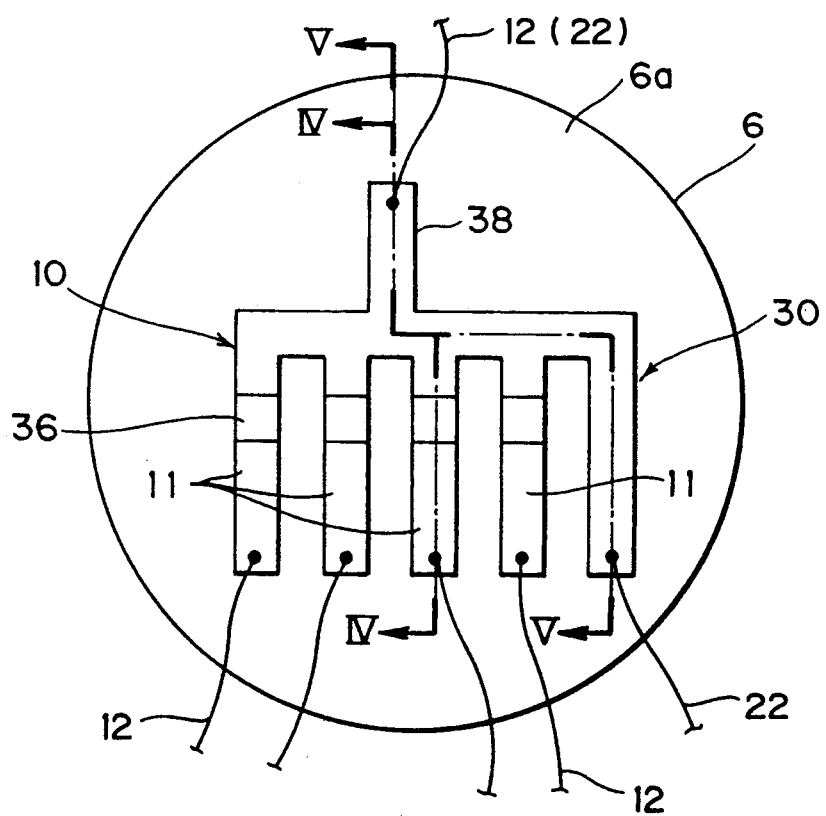
FIG. 3 is a plan view of an inner tube of the apparatus of FIG. 2 showing a device mounting portion.

Referring to FIG. 2, an infrared rays detecting device 10 formed from compound semiconductor crystal of HgCdTe or the like and a dummy element 30 formed from compound semiconductor crystal of the same material are mounted adjacent to each other on a device mounting portion 6a at the end of an inner tube 6 which is formed from KOVAR and glass joined together to each other. As best shown in FIG. 3, the infrared rays detecting device 10 includes a plurality of infrared rays detecting elements 11, and the dummy element 30 is disposed adjacent the infrared rays detecting device 10. Each of the infrared rays detecting elements 11 has a light detecting portion 36 while no such light detecting portion is provided on the dummy element 30. A lead wire 12 for each of the infrared rays detecting elements 11 and a lead wire 22 for the dummy element 22 are connected to a common ground electrode 38. Meanwhile, another lead wire 12 is connected to a contact electrode of each of the infrared rays detecting elements 12, and another lead wire 22 is connected to a contact electrode of the dummy element 30.

Subsequently, structure of the infrared rays detecting device and structure of the dummy element will be described with reference to FIGS. 4 and 5. First, structure of each of the infrared rays detecting elements 11 constituting the infrared rays detecting device 10 will be described with reference to FIG. 4. The common ground electrode 38 and a contact electrode 42 are formed on compound semiconductor crystal 40 of HgCdTe or the like, and a ZnS reflection preventing film 44 is formed on those elements. A light interrupting film 46 which has an opening defined therein is placed in layer on the reflection preventing film 44. The opening of the light interrupting film 46 functions as a light detecting portion 36 of the infrared ray detecting element 11.

Figure 4:
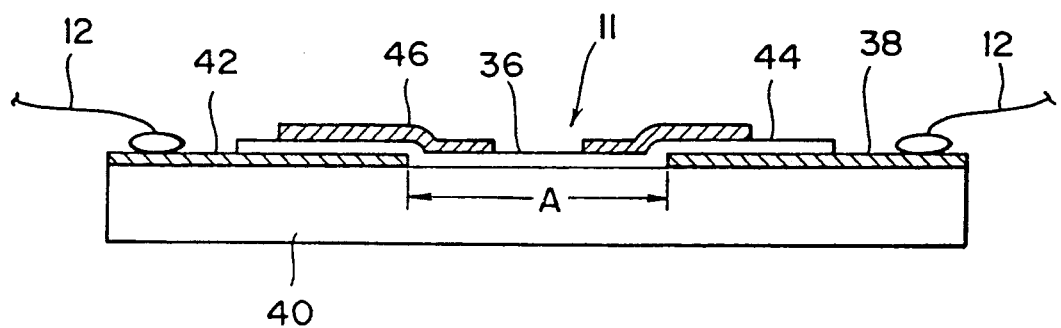
FIG. 4 is a sectional view taken along line IV—IV of FIG. 3 showing a section of an infrared rays detecting element.
Figure 5:
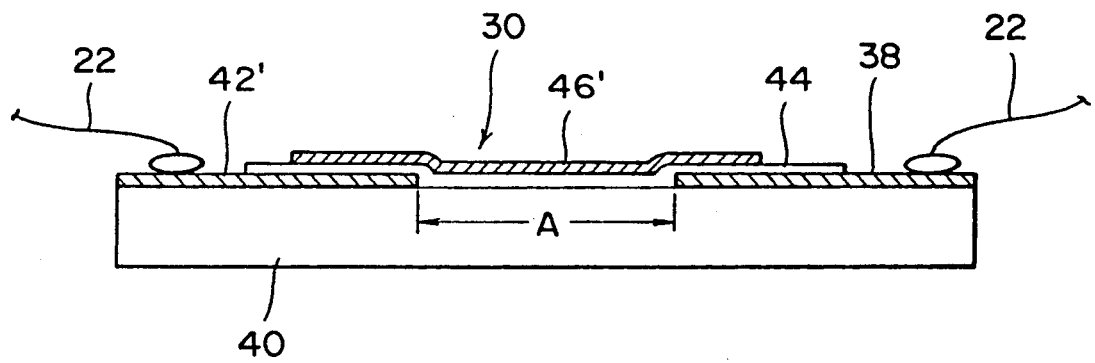
FIG. 5 is a sectional view taken along line V—V of FIG. 3 showing a section of a dummy element.

The dummy element 30 shown in FIG. 5 is different in structure from the infrared rays detecting element 11 of FIG. 4 in that a light interrupting film 46' placed in layer on the reflection preventing film 44 does not have an opening defined therein. The structure of the remaining portion of the dummy element 30 is quite the same as that of the infrared rays detecting element 11, and thus, the distance A between a contact electrode 42' and the common ground electrode 38 of the dummy element 30 is equal to the distance A between the contact element 42 and the common ground electrode 38 of the infrared rays detecting element 11.

The compound semiconductor crystal 40 is varied in resistance in response to a cooling temperature. And, the resistance of the infrared rays detecting element 11 is varied when infrared rays are introduced to the light detecting portion 36 thereof. Since the distance A between the electrodes of each of the infrared rays detecting elements 11 constituting the infrared rays detecting device 10 is made equal to the distance A between the electrodes of the dummy element 30 and besides the infrared rays detecting device 10 and the dummy element 11 are formed from the same compound semiconductor crystal 40, they are substantially equal in resistance to each other and hence have substantially same temperature variations. Accordingly, a variation in resistance of the infrared rays detecting elements 11 arising from a temperature variation can be detected precisely from a variation in resistance of the dummy element 30. Thus, as illustrated in FIG. 2, the dummy element 30 is connected to a temperature detection circuit 32 by way of the lead wires 22, terminals 24 and lead wires 26. As a result, a variation in temperature can be calculated from a variation of the resistance.

The temperature detection circuit 32 detects a temperature from a resistance of the dummy element 30, and a cryogenic cooling device not shown is driven by way of a temperature controlling circuit in response to a temperature detected by the temperature detection circuit 32 such that the device mounting portion 6a of the inner tube 6 may be maintained at a predetermined temperature. On the other hand, a variation in resistance of the dummy element 30 is inputted to a compensation circuit 34, which corrects a detection value (resistance value) of the signal detection circuit 18 in response to a variation in resistance of the dummy element 30. Consequently, even if the temperature of the infrared rays detection device 10 is varied within a certain range (for example, ±1° C. with respect to a predetermined value), a possible variation of an output signal arising from such temperature variation is compensated for strictly by the compensation circuit 34. Accordingly, a possible fluctuation of an infrared rays image which may otherwise arise from a temperature variation can be prevented effectively.

What is claimed is:

1. An infrared rays detecting apparatus, comprising:
   an outer tube having a window through which infrared rays pass;
   an inner tube having, at an end thereof, a device mounting portion exposed to the infrared rays which pass through the window in said outer tube;
   means for maintaining a spacing between said outer tube and said inner tube in a vacuum condition;
   an infrared rays detecting device, mounted on said device mounting portion of said inner tube and formed of a material, having at least one infrared rays detecting element with a light detecting portion defined by a light interrupting film and a pair of electrodes;
   a dummy element, mounted adjacent to said infrared rays detecting device on said device mounting poriton of said inner tube, said dummy element being formed from the material used to form said infrared rays detecting device and having a similar structure to that of said at least one infrared rays detecting element with a first distance between the electrodes of said infrared rays detecting element equal to a second distance between the electrodes of said dummy element, and having a surface of said dummy element entirely covered with another light interrupting film;
   cryogenic cooling means for cooling said infrared rays detecting device and said dummy element to a low temperature;
   temperature detecting means, connected to said dummy element, for detecting a temperature of said dummy element; and
   correcting means for correcting an output of said infrared rays detecting device in response to the temperature detected by said temperature detecting means.

2. An infrared rays detecting apparatus according to claim 1, wherein said infrared rays detecting device is a device of a multi-element type which includes a plurality of infrared rays detecting elements.

3. An infrared rays detecting apparatus according to claim 1, wherein said infrared rays detecting device and said dummy element are made of HgCdTe crystal.

4. An infrared rays detecting apparatus according to claim 1, wherein the infrared rays are received substantially uniformly on said device mounting portion of said inner tube.

5. An infrared rays detecting apparatus, comprising:
   an outer tube having a window through which infrared rays pass;
   an inner tube having a device mounting portion at an end thereof;
   means for maintaining a spacing between said outer tube and said inner tube in a vacuum condition; and
   infrared rays detecting means, mounted on the device mounting portion of said inner tube, for detecting infrared rays, said infrared rays detecting means including an infrared rays detecting device with a plurality of detection elements, each having an individual electrode and a light detecting portion, and a dummy element formed integrally in said infrared rays detecting device using material arranged as in the detection elements, but without the light detecting portion, the detection and dummy elements having a common electrode.

6. An infrared rays detecting apparatus according to claim 5, wherein said infrared rays detecting device and said dummy element are made of HgCdTe crystal.

* * * * *